United States Patent
Ong et al.

(10) Patent No.: US 7,675,747 B1
(45) Date of Patent: Mar. 9, 2010

(54) REVERSIBLE, COUNTER-ROTATING FAN MODULES FOR A COMPUTER CHASSIS

(75) Inventors: Brett C. Ong, San Jose, CA (US); Timothy W. Olesiewicz, Santa Clara, CA (US); Kenneth D. Shaul, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/331,982

(22) Filed: Dec. 10, 2008

(51) Int. Cl.
*H05K 7/20* (2006.01)
*H05K 5/00* (2006.01)
*F01D 1/02* (2006.01)

(52) U.S. Cl. .................. 361/679.48; 361/679.46; 361/694; 361/695; 415/61; 454/184

(58) Field of Classification Search .......... 361/679.46, 361/679.48–679.5, 690, 694–695; 165/80.3; 415/61, 193, 198.1; 454/184
See application file for complete search history.

(56) References Cited

U.S. PATENT DOCUMENTS

| 5,546,272 | A | * | 8/1996 | Moss et al. ............. 361/679.48 |
| 5,572,403 | A | * | 11/1996 | Mills ...................... 361/695 |
| 6,244,818 | B1 | * | 6/2001 | Chang ..................... 415/208.2 |
| 6,537,019 | B1 | * | 3/2003 | Dent ........................ 415/61 |
| 6,587,342 | B1 | * | 7/2003 | Hsu ......................... 361/695 |
| 6,603,661 | B2 | * | 8/2003 | Smith et al. ............... 361/695 |
| 6,708,920 | B2 | * | 3/2004 | Fukuyama ................. 244/12.4 |
| 6,817,831 | B2 | * | 11/2004 | Stevens et al. ............. 415/61 |
| 6,961,248 | B2 | * | 11/2005 | Vincent et al. ............. 361/796 |
| 7,285,756 | B2 | * | 10/2007 | Leppich et al. ............. 219/400 |
| 7,434,743 | B2 | * | 10/2008 | Barsun et al. ............. 236/49.3 |
| 7,492,591 | B1 | * | 2/2009 | Aybay et al. .............. 361/695 |
| 7,542,272 | B2 | * | 6/2009 | Pike et al. ............... 361/679.48 |
| 2005/0163615 | A1 | * | 7/2005 | Chheda et al. ............ 416/31 |
| 2007/0076368 | A1 | * | 4/2007 | Pike et al. ................ 361/687 |
| 2008/0038111 | A1 | * | 2/2008 | Iwasaki et al. ............. 415/198.1 |
| 2009/0129918 | A1 | * | 5/2009 | Takeuchi et al. ........... 415/199.4 |

FOREIGN PATENT DOCUMENTS

JP          08025982 A  *  1/1996

* cited by examiner

*Primary Examiner*—Jayprakash N Gandhi
*Assistant Examiner*—Robert J Hoffberg
(74) *Attorney, Agent, or Firm*—Marsh, Fischmann & Breyfogle LLP; Kent A. Lembke; Jon Deppe

(57) ABSTRACT

A fan module for use with fan trays or decks within a computer chassis for forced-air cooling with counter-rotating flow to provide higher static pressure. The fan module may have a conventional side-by-side form factor with a first and second fans supported within first and second housings. The first and second housings are spaced apart and arranged side-by-side. The first fan has a clockwise-rotating blade, and the second fan has a counterclockwise-rotating blade. In the fan module, the first and second fans may be axial fans with the blades rotating about first and second axes that are offset and parallel. In some embodiments, the fan module may have airflow through the first fan in a first direction along the first axis and airflow through the second fan in a second direction along the second axis, with the first and second directions generally matching.

14 Claims, 7 Drawing Sheets

REVERSIBLE, COUNTER-ROTATING FAN MODULES FOR A COMPUTER CHASSIS

BACKGROUND OF THE INVENTION

1. Field of the Invention

The present invention relates, in general, to methods and systems for cooling electronic components such as processors in servers and other computing devices, and, more particularly, to a design for fan modules configured to provide counter-rotating fans to provide increased static pressure while facilitating installation into and removal from a computer chassis (e.g., a server chassis/box or the like) and providing form factors useful for existing chassis and/or fan chambers.

2. Relevant Background

Removal of heat has become one of the most important challenges facing computer designers as failure to adequately cool devices can cause failure or operating problems. The rate of power dissipation from electronics components such as from processors (or CPUs) in high-performance server units continues to increase. In most cases, air cooling is used to remove heat from a heat generating surface of a CPU, a motherboard, and other components of the server or other computer/electronic product, with each chassis or box containing the heat generating components including one or more fans that draw air into the chassis or box to provide cooling and allow continued operation of the components.

For example, FIG. 1 illustrates a server (or other computer system) 100 that is designed to use forced-air cooling. The lid of the server chassis 110 is removed to show a motherboard with processors and other electronic components 120 that require cooling during operation of the server 100. The chassis 110 may be divided into two chambers with the motherboard 120 placed in one chamber of the chassis along with a number of fans 130 (in a fan chamber), with the fan chamber typically having a particular size and configuration (or form factor) that dictates the form factor of fans or fan modules 130 installed in the chassis 110. During operation of the server 100, the motherboard and other components 120 are cooled by redundant rows of fans 130 that are mounted to draw in cooling air 132 through a vented/open sidewall of the chassis 110 and eject the air 136 through another vented/open sidewall of the chassis 110 after it has been heated by the heat released from the motherboard and other components 120.

As shown schematically in FIG. 2, a cooling fan system 210 (e.g., as may be used to provide the fans 130 of FIG. 1 or the like) may be provided in a chamber in two or more fan trays 220, 230. The cooling fans 224, 234 may be provided in pairs within a number of modules 222, 232 with the fans 224, 234 positioned in two or more rows for redundancy (e.g., behind the front wall or bezel of the chassis). The fan modules 222, 232 may, of course, vary in configuration to provide cooling with one typical fan module being populated with or including a pair of 40 mm, 15000 RPM fans and with a chamber 210 typically including at least 4 but typically 6 or more modules 222, 232 (or 8 to 12 or more fans 224, 234 per server or computer product). The modules 222, 232 as well as the included fans 224, 234 are typically hot swappable with each fan module including an LED fault indicator to facilitate maintenance or replacement. The fans 224, 234 are accessible in many chassis designs from a hinged hatch door in the side of the server chassis or over the fan chamber 210. This arrangement makes it possible to access the fan modules 222, 232 without interrupting system operation, with maintenance or swapping typically involving removing one or more of the fan modules 222, 232 and inserting a new or a repaired module in its place. Hence, it is typically preferable that the modules 222, 232 be of an interchangeable design allowing one module to be removed and another to be installed without concern of improper installation and/or operation (e.g., a fan positioned with incorrect airflow direction or the like).

An ongoing challenge for the design of cooling fans and fan modules is providing adequate airflow through a computer chassis. As the performance of computer systems increases, so does the amount of heat generated by various system components. Effective system cooling requires careful management of airflow, and, due to the increased heat or thermal output of chassis components, more airflow is required to achieve effective cooling. Computer chassis are more often being designed with high density of components that creates high impedance bottlenecks where cooling airflow is restricted or nearly blocked. As a result, effective cooling of these systems requires fans or fan modules that can achieve or provide high static pressure to overcome the restrictions and pressure drop within the chassis. Arranging two rows of fan modules as shown in FIGS. 1 and 2 is mainly provided to provide redundancy but it does increase the achieved static pressure to provide two adjacent fans.

Unfortunately, existing fan modules are typically arranged with pairs of fans in adjacent rows operating or rotating in the same direction (e.g., both fans rotate in a clockwise or counterclockwise direction), and such an arrangement does not double the static pressure and often does not increase static pressure sufficiently to provide a desired cooling airflow through the high impedance chassis or computer components. Some work has been done to provide counter-rotating fans to increase static pressure. For example, custom designed cooling fans have been produced with a single housing or module that includes two fans with a shared central axis that rotate in opposite or counter directions (i.e., a counter-rotating fan assembly or counter-rotating flow). These fans provide higher static pressures, but their housings present a different and incompatible form factor than generally found in fan chambers of existing chassis, e.g., do not present side-by-side pairs of fans. Further, these fans do not properly support redundancy as failure often causes a portion of a chassis to not be cooled, in contrast to the designs of FIGS. 1 and 2 where a single fan or module failure does not end airflow but only reduces it.

Hence, there remains a need for enhanced fan module designs that provide fan arrangements with higher static pressure to provide increased airflow through a computer chassis. Preferably, such fan module designs would also facilitate installation of the fan modules within a chassis fan tray or deck without requiring modifications to the chassis or fan chamber (e.g., with the same or similar form factor as existing fan modules).

SUMMARY OF THE INVENTION

Briefly, the above and other issues with prior fan module designs are addressed with a reversible, counter-rotating fan module described in the following paragraphs and shown, for example, in FIGS. 3-7. More particularly, a fan module is provided for use with fan trays or decks within a computer or electronics chassis for forced-air cooling. The fan module may have a conventional form factor and be sized for positioning in one of two rows or banks on the fan tray/deck (or fan chamber in a computer or server chassis). Each fan module may include a first fan supported within a first housing, and a second fan supported within a second housing. The first and second housings are spaced apart and arranged side-by-side. The first fan has a clockwise-rotating blade(s) and the second fan has a counterclockwise-rotating blade(s). In the fan module, the first and second fans may be axial fans with the blades rotating about first and second axes, and the first and second axes of these fans may be offset (e.g., not concurrent as in some custom counter-rotating fan designs in which two fans are provided within a single housing and arranged to direct flow along a single axis) and parallel (or substantially parallel such as a few degrees off of parallel to account for manufacturing tolerances and the like). When two of such fan modules are arranged side by side (e.g., in adjacent rows of a fan chamber of a server housing), the modules are positioned to achieve counter-rotating flow by placing one module with its clockwise rotating fan on the right side and one module with the clockwise rotating fan on the left side of the module (or vice versa).

In some embodiments, the fan module may have airflow through the first fan in a first direction along the first axis and airflow through the second fan in a second direction along the second axis, with the first and second directions generally matching (e.g., both fans direct airflow in a left or a right direction when the module is viewed along a side). The fan module may include a connector or bridge assembly with a body positioned between the first and second housings, with the connector body connecting the first housing to the second housing. The fan tray may include edge connectors arranged in a pattern (e.g., keying pattern) defining a set of locations for the fan module to mount to the fan tray, whereby counter-rotating flow occurs between an adjacent pair of the fan modules positioned on the fan tray (e.g., each pair of fans in the two rows or banks on the fan tray/deck are counter-rotating fans). The body of the connector assembly may include a pair of edge connector receptacles, and each receptacle may be adapted for receiving one of the edge connectors. To provide reversibility of the module (i.e., either side of the housing may be the upper or lower edge/side of the module), the edge connector receptacles are positioned on opposites ends of the body and on one side of the body (e.g., both receptacles are offset from the center of the body and on a single side of the body such as on the right or left side or near one of the fans (both receptacles proximate to the CW or CCW fan)).

DETAILED DESCRIPTION OF THE PREFERRED EMBODIMENTS

Briefly, embodiments of the present invention are directed to fan modules for use in cooling electronic components within a chassis or box such as a computer system/server. The fan modules described may be considered reversible, counter-rotating fan modules because the modules are configured for use and positioning in two or more parallel or side-by-side rows within a computer chassis (e.g., within a fan chamber of a server box/housing or the like) to provide counter-rotating fans that provide higher static pressure along a particular flow path (e.g., the aligned and paired fans have matching flow directions but rotate in opposite rotation directions to cause air to flow parallel to a central axis or central axes of two or more aligned fans). The modules are reversible in that the two fans in each module may be positioned in either the left or right position by reversing their mounting upon a fan mounting board or fan deck/tray. In other words, the portion of the module positioned to face up or away from the mounting board may be reversed to position a clockwise or a counter-clockwise fan in the right or left location, which allows a single fan module design to be used for each of the fan modules within a set of such modules in a fan chamber/computer chassis. In some embodiments, mounting connectors protrude upward in a particular, fixed pattern and matching edge connectors are provided in the fan modules in an alternating pattern that allows either end of the module to be "up" in the chassis and either fan to be the right or left-positioned fan so as to support easy maintenance and replacement of the fan modules with a new or replacement module.

Figure 1:
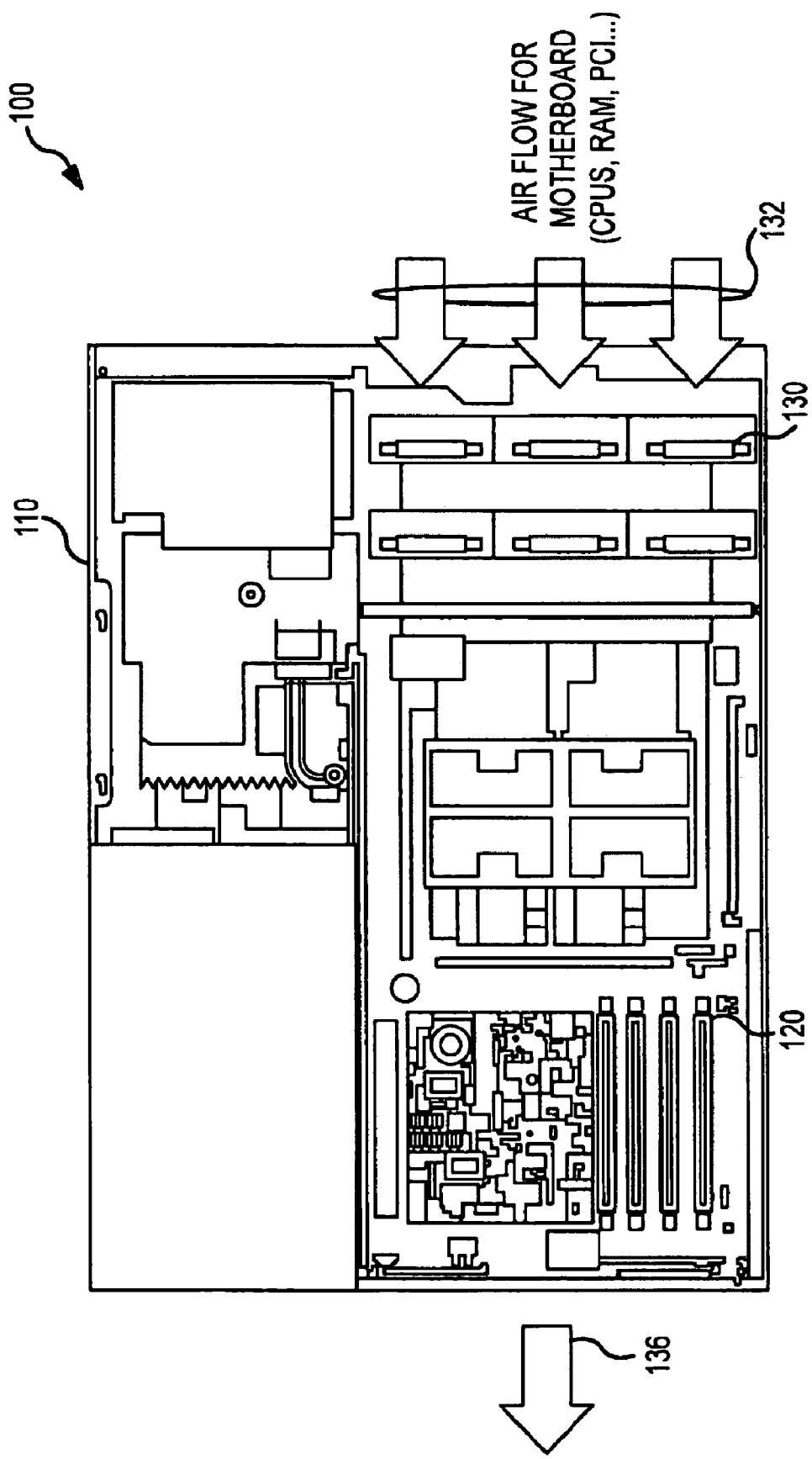
FIG. 1 illustrates a server with a lid of a chassis removed to show a set of cooling fan modules in a fan chamber of the chassis adjacent a motherboard.
Figure 2:
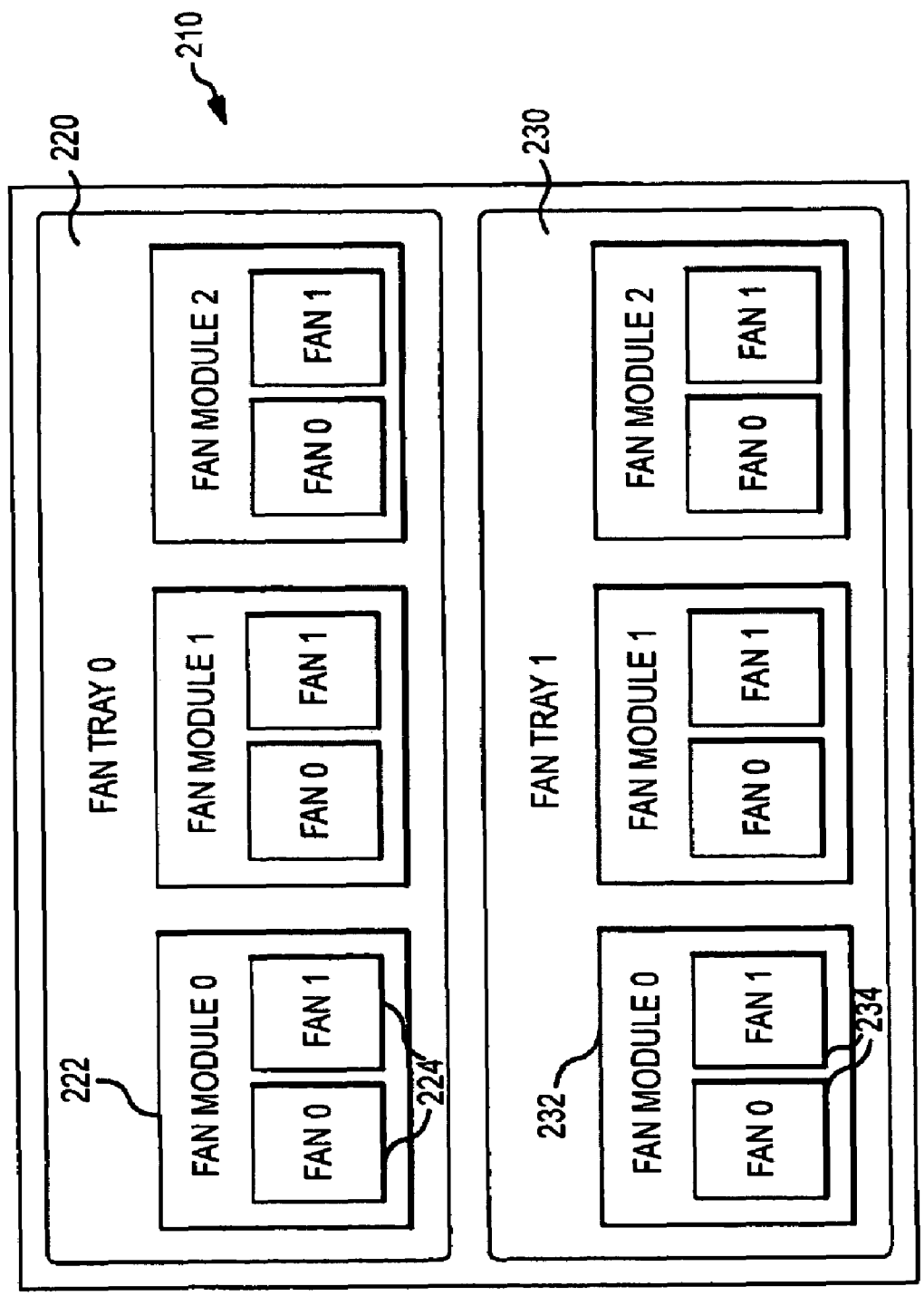
FIG. 2 is a functional block diagram of a server cooling fan system with a set of fan modules arranged in two rows in two adjacent trays to provide redundancy and facilitate hot swapping of the fans.

For example, the fan modules described below and in FIGS. 3-7 may be used as the fan modules of the servers and/or fan chambers 100, 210 of FIGS. 1 and 2. The design of the fan modules provides fan module with two fans that has a form factor matching or adequately similar to allow the fan modules to be used in place of standard side-by-side fan modules (e.g., presently used fan modules with both fans operating or rotating in a single direction). The reversible, counter-rotating fan module may incorporate two counter-rotating fans arranged side-by-side in a single fan module or fan assembly. One fan spins clockwise (CW), and one fan spins counterclockwise (CCW). Both fans, though, are adapted to move air in the same direction (e.g., the flow direction is generally the same but offset and parallel (e.g., along the axes of the two side-by-side fans, with the axes being parallel or nearly so)).

Airflow may further be controlled or directed by providing an air guide at the outlet side of each fan in a fan module, e.g., an integrated air guide with foam or other airflow seals for providing a mating or air seal with an inlet for a counter-rotating fan in an adjacent fan module. The air guides, with foam or similar airflow seals, seal off on the row of fans behind or adjacent and limit pressure loss. The arrangement of the two (or more) rows of fans in the sets of fan modules is that each fan pair in the adjacent rows provides a counter-rotating, front-back fan combination or assembly. During operation, these pairs of fans provide much higher static pressure and, also, reduced fan vibration as compared with pairs of same-direction axial fans.

In one embodiment, the fan modules within the chassis (e.g., two to six or more of the fan modules) are each connected to an offset, double-sided edge connector, e.g., as provided by a printed circuit board assembly (PCBA) or the like. The offset edge connector allows fan modules to be installed either side up or down (e.g., "top" down or "bottom down") such that the fans are reversible. By positioning the connectors on the fan board in a particular pattern and providing a matching connector receptacle on the fan module (such as a female connector in the bridge or connector between the two fan housings in the module), the fan modules may be forced into proper positions. Specifically, a fan in one row is always counter rotating relative to a paired fan in an adjacent row. This design of the modules and the mounting board/tray enables the use of a single fan module on both (or more) rows in a fan chamber such as in a server chassis, as the module is reversible and installation is keyed (or designated to a particular arrangement). The fan modules may have similar form factor as existing side-by-side fan modules such that these new, counter-rotating fan modules may be used within existing server or computer chassis architecture (e.g., dual bank or dual row cooling fans provided to meet redundancy requirements on many servers) to provide improved thermal performance with a higher static pressure fan system. The reversible and keyed design of the module allows for a single fan module design to be used in both banks or rows. Hence, the fan modules will likely provide a low cost design, are compatible with existing systems and designs for computer products such as servers, provide nearly fool-proof installation and replacement to provide proper counter-rotating arrangements (e.g., each pair of fans will be counter-rotating due to the matching male/female connectors), reduce fan vibration, and provide increased static pressure and improved thermal performance even in dense electronic components applications.

Figure 3:
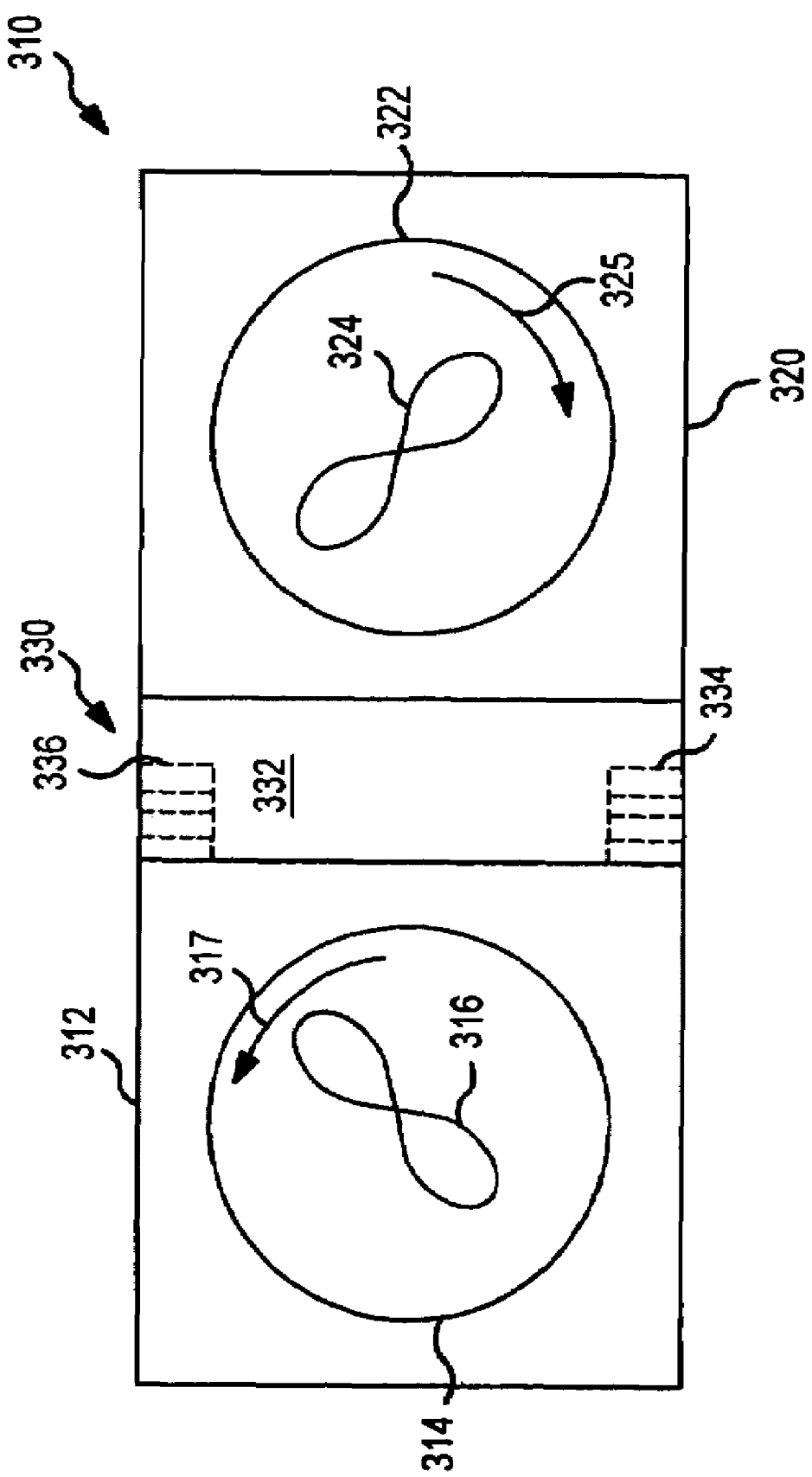
FIG. 3 is a front view of one embodiment of a fan module with a pair of counter-rotating fans (e.g., fans rotating in opposite directions about their axes) arranged side-by-side.

FIG. 3 illustrates a front view of one embodiment of a counter-rotating fan module 310. As shown, the module 310 generally is configured similarly to other conventional side-by-side fan modules, which allows it to be used in place of such modules as it presents a similar or even identical form factor. The module 310 includes a first or left fan housing 312 and a second or right fan housing 320. The first fan housing 312 is attached to the second fan housing 320 with a connector assembly or bridge 330 that is attached to or connected to the inner sides of the housings 312, 320. The module 310 facilitates counter-rotating flow when paired with other fans (e.g., a similarly-designed module in an adjacent row or bank in a server fan chamber) by providing a first fan 314 that includes a blade(s) 316 that rotate in a first direction (e.g., CCW) 317 and a second fan 322 in the second housing 320 that has a blade(s) 324 that rotate in a second direction (e.g., CW) 325. The fans 314, 322 typically are axial fans, and the first and second directions 317, 325 are in opposite directions about the axes of the fans 314, 322. In some embodiments, the axes of the fans 314, 322 and the direction of flow through them is parallel and in the same direction (e.g., into or out of the plane of the page containing FIG. 3).

The module 310 supports reversible and known or keyed installation in a fan chamber (e.g., on a PCBA board or the like) with the configuration of the connector or bridge assembly 330. The assembly 330 functions to connect the two fan housings 312, 320. The body 332 may be formed from a rigid material such as plastic or metal and/or function to absorb vibration and the body 332 formed of an elastomer or similar material. The body 332 also includes two edge connectors 334, 336 that facilitate the mounting of the module 310 onto a mounting board or fan tray/deck (not shown in FIG. 3). In some embodiments, the connectors 334, 336 are provided at opposite ends of the body 332 and are female receptacles or recessed surfaces for receiving a male connector on the board/tray (or the opposite arrangement may be used in some cases). The location of the connectors 334, 336 (when combined with an alternating or offset pattern on the mounting board or fan deck/tray) is selected to allow either fan 314, 322 to be positioned as the left or right fan within a fan chamber or computer chassis, as is explained in more detail below. In other words, the placement of the connectors on a single side (or single location relative to a center line or portion of the body 332), the module 310 may be inserted within or mounted onto a protruding connector or mounting element with either fan on the left or right sides (to properly pair with a fan in an adjacent fan bank or row to provide counter-rotating flow, i.e., air flow is through a CW rotating fan and also through a CCW rotating fan (or CCW/CW fan pairs) as it travels through two fan modules positioned adjacent to each other in two rows of such modules).

Figure 4:
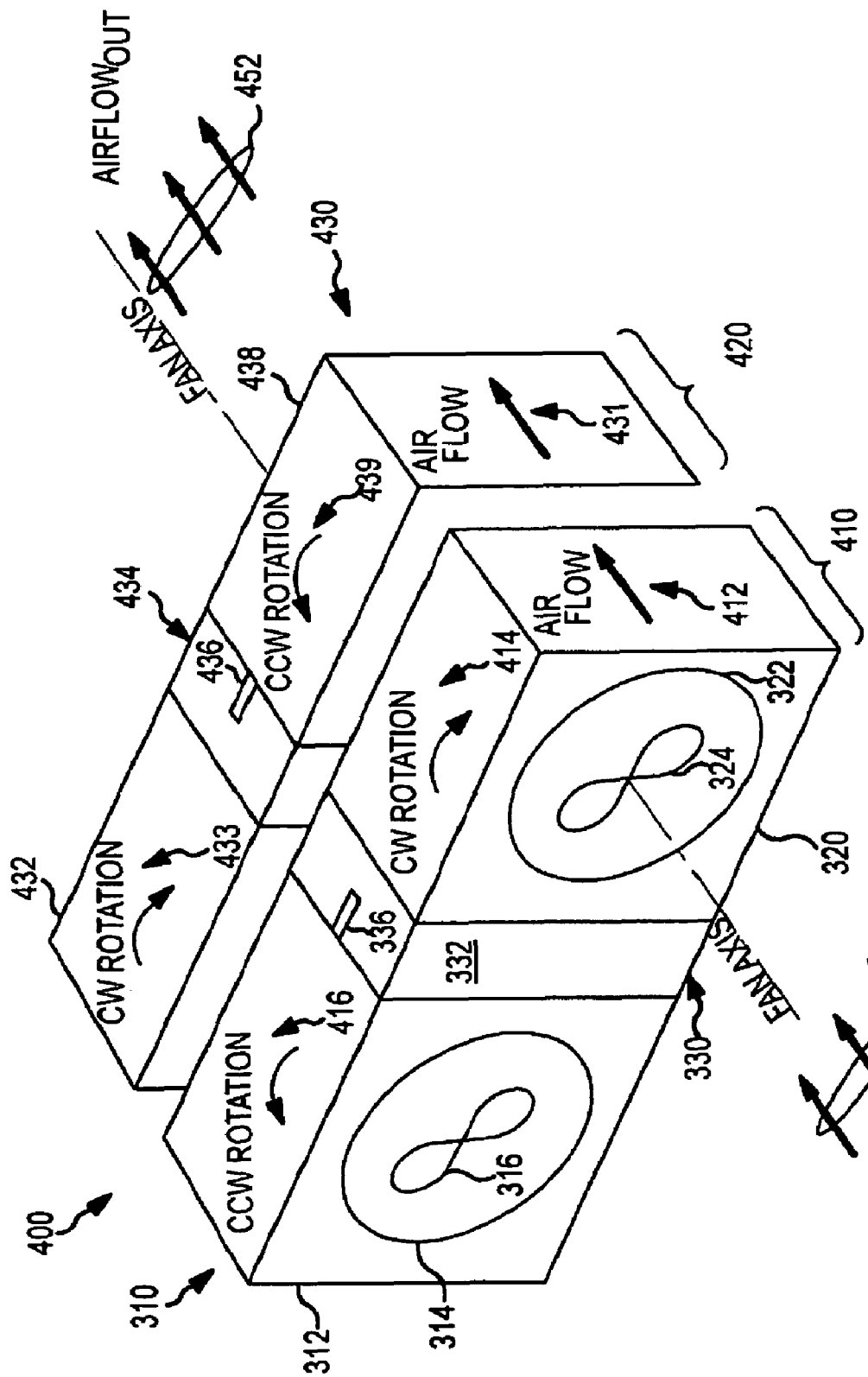
FIG. 4 is a perspective view of a counter-rotating cooling fan assembly (or a portion thereof) as may be installed within a fan chamber or other portion of a computer chassis, showing two adjacent rows or fan modules providing pairs of counter-rotating fans in adjacent rows within the assembly.

FIG. 4 illustrates a cooling fan assembly 400 (or a portion of such an assembly) that includes the fan module 310 from FIG. 3. To provide counter-rotating flow, the fan module 310 may be positioned within a row or fan bank 410 of a fan chamber or other location within a computer chassis (e.g., a chassis of a server or the like). In an adjacent or successive row/bank 420, a similarly designed fan module 430 may be positioned, but the module 430 is reversed or rotated such that its two fans rotate in opposite or counter directions relative to the fans 314, 322 of the first module 310. Such a reversed positioning is dictated or keyed by the location of the mounting connectors on the board or fan tray (not shown in FIG. 4) as evidenced by the offset locations of the upper or exposes connector receptacles 336, 436 in the connector assemblies 330, 434.

The fan module 310 is placed in a first or forward row/bank 410 in the assembly 400. The left fan 314 is a CCW rotating fan as shown with a label/marking 416 (to assist maintenance or assembly of the assembly 400). The module 310 also includes a label 412 indicting a direction of air flow (e.g., generally into the plane of the page containing FIG. 4), and both fans 314, 322 have a similar airflow direction despite having blades 316, 324 that rotate in opposite directions. The fan housing 320 may also include a label 414 indicating that the fan 322 contained in the housing 320 is a CW rotating fan. During operation of the assembly 400, the fan 322 draws air in 450 using CW rotation of blade(s) 324 such that the air 450 generally flows along the fan axis.

Counter-rotating flow is achieved by a combination of the module 310 with the module 430. The module 430 is positioned in a second, adjacent row/bank 420 but with its fans in reverse or opposite positions. Specifically, the second or paired fan module 430 includes a first or left fan housing 432 that includes a fan (not shown in FIG. 4) that is a CW rotating fan, as indicated by label 433. The module 430 also includes a second or right fan housing 438 that includes a fan (not shown in FIG. 4) that is a CCW rotating fan (i.e., opposite rotation direction as the first or left fan), as indicated by housing label 439. The fans may be a pair of 40 mm, 15,000 RPM fans or other cooling fans typically used for cooling servers and other computer/electronics products with the specific size and design of the fans not being limiting of fan modules described herein. Airflow through and out of the fan module 430 is shown at 452 to be in the same direction as the fan module 310 (e.g., generally into the plane of the page containing FIG. 4), such that each pair of fans in the assembly is additive and counter-rotating to provide increased static pressure. For example, the fans in housings 320, 438 provide a pair of counter-rotating fans that are positioned adjacent to each other (or in adjacent rows/banks) and, typically, with their fan axes generally aligned or coinciding (or at least substantially parallel if a small offset in the axes occurs in installation or due to manufacturing tolerances). The fan housings 432, 438 are linked by a connector assembly 434 that is designed similarly to the connector assembly 330 with a pair (or more) of board or tray connectors/connector receptacles, with connector receptacle 436 shown in FIG. 4 (and the other receptacle hidden from view at the bottom of connector assembly 434) and located at an offset to the connector receptacle 336 (or on the opposite side of connector body).

Figure 5B:
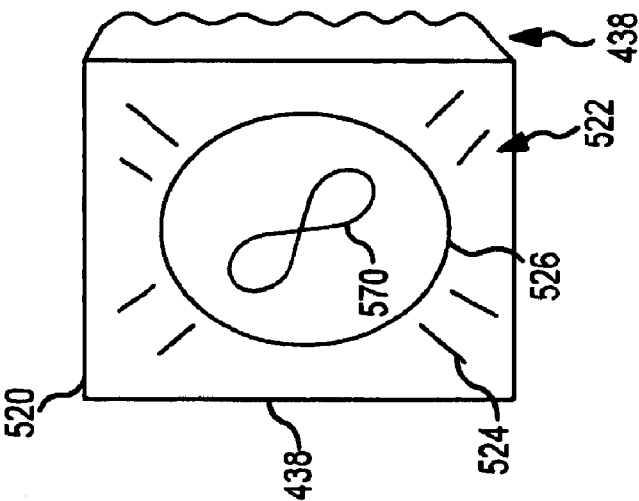
FIGS. 5A and 5B illustrate side and rear views, respectively, of the cooling fan assembly of FIG. 4.
Figure 5A:
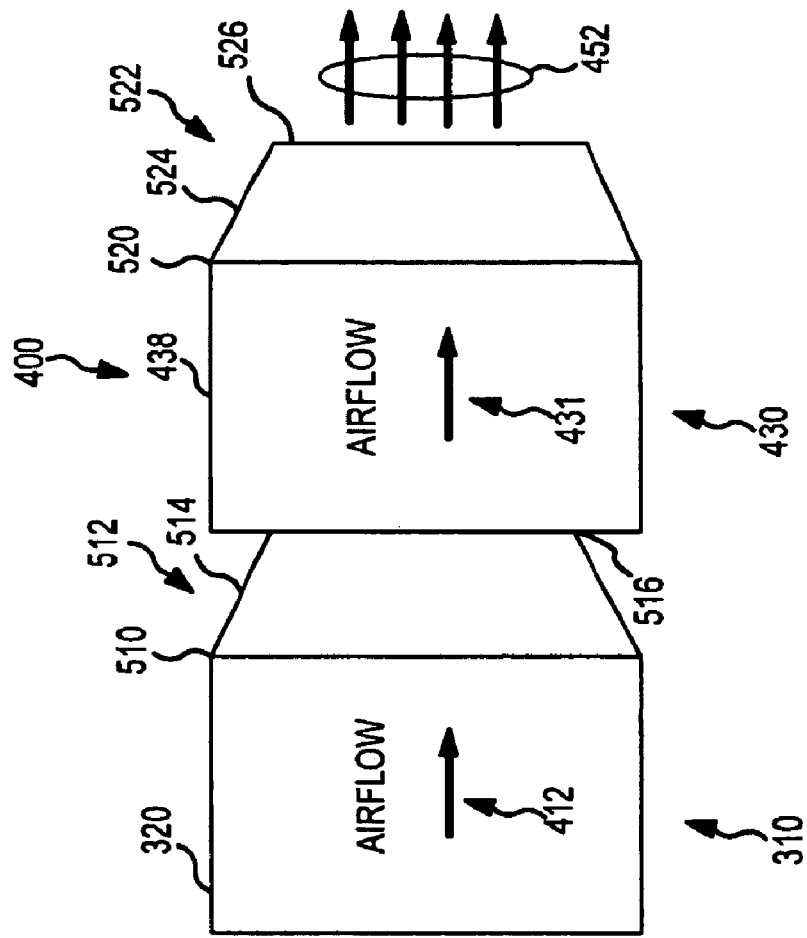

FIG. 5A illustrates a side view of the cooling fan assembly 400 as it may appear after installation within a computer chassis (e.g., a fan chamber of a server housing or the like). The housing labels 412, 431 indicate that the airflow is in the same direction (e.g., to the right) through both fan housings 320, 438, and this is supported with the diagrammatic representation of incoming air 450 drawn into fan housing 320 and outgoing or outlet air 452 being discharged from the outlet of fan housing 438. In some embodiments, the paired fans of housings 320, 438 may be positioned to be nearly abutting or abutting such that the discharge or outlet side or wall 510 of the housing 320 contacts or is near the inlet side or wall of housing 438. More typically, though, there is a spacing or separation between the two fan banks or rows (e.g., a first fan tray may be spaced apart a distance such as up to 1 to several inches). In some embodiments, the counter-rotating fan modules 310, 430 may be spaced apart.

However, as shown in FIG. 5A, some assemblies 400 may be adapted to reduce pressure drops (e.g., increase static pressure achieved) by interconnecting adjacent fans in the paired or adjacent fan modules 310, 430. Generally, an airflow guide 512 is provided in the assembly 400 to connect the outlet of the fans of the first row 410 with the inlets of the fans of the second row/bank 420. The airflow guide 512 may take a number of forms in accordance with the invention and typically functions to eliminate air leakage or to direct all or most of the air discharged from the first fan row/bank to the inlets of the fans in the second fan row/bank. As shown in FIGS. 5A and 5B, this is achieved with a conical (or frustoconical) shaped air guide 512, 522 that is attached to or positioned to abut the outlet side or wall 510, 520 of each fan housing 320, 438. The air guides 512, 522 have a height selected to match (or slightly exceed) the separation distance between the housings (or fan supports/frames) 320, 438 in the assembly 400.

The body or sidewall 514, 524 of the guides 512, 522 may be rigid (e.g., plastic, metal or the like) or may be formed of an elastomeric material (or non-rigid material) such as a plastic, rubber, or foam such that the guide 512, 522 may be thought of as having an airflow seal 516, 526 that mates with and conforms with the inlet of the adjacent or paired (succeeding) fan in the assembly 400. In other embodiments, the airflow seal 516, 526 is formed of foam or an elastomer to provide the seal while the body 514, 524 is formed of a more rigid material with smooth inner surfaces to reduce air resistance within the guide 512, 522. FIG. 5B shows an end view of the air guide 522 that shows that the seal 526 (and outlet of the body 524) is generally circular in shape, with its size and shape selected to match the inlet configuration of the fans or housings 320, 438. Blade 570 is shown in module 430 and the outlet 526 may be sized based on the size of this blade 570 or otherwise to suit a particular discharged airflow 452. Again, the seal 516 typically abuts the adjacent housing 438 and forms a seal that prevents or minimizes air leakage. The sealing may be enhanced, in some cases, by a relatively small amount of pressure or compressive force being applied on the seal 516, 526 during positioning of the housings 320, 438 adjacent to each other (e.g., the guides 512, 522 may be sized such that they have to be compressed (or the seals 516, 526 have to be compressed) to allow them to be fit into the fan chamber or on a fan tray/deck).

The connectors/bridges between the fan housings/frames and the airflow guides may be formed using a wide variety of elastomers such as unsaturated rubbers (e.g., natural rubber, synthetic polyisoprene, butyl rubber, polybutadiene, styrene-butadiene rubber, nitrile rubber, choloroprene rubber, and the like), saturated rubbers (e.g., EPM rubber, EPDM rubber, silicone rubber, polyacrylic rubber, and the like), thermoplastic elastomers, thermoplastic polyurethane, thermoplastic olefins, and the like, with the specific elastomer chosen to form the bodies/sidewalls/seals depending on design parameters such as desired hardness, size and configuration of seal and fan inlets, and so on. In one embodiment, the components are formed composite materials such as solid vinyl, thermoset materials, or the like, e.g., as available from E-A-R Specialty Composites (e.g., the ISODAMP C-1002, C-1105, or C-1100 product line, the ISOLOSS HD product, the ISOLOSS SL-20100 or SL-25200 product line, or the like) or from similar material producers or distributers.

As discussed in the background, forced-air cooling with fans is required for many electronic components and devices/systems using such systems. For example, but not as a limitation, the electronic components may be high performance CPU or similar component for a computer or computing device such as a server or data storage computer system. For purposes of this disclosure, a "server" may include nearly any computer system and electronic component providing instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, a "server" in this sense may be a computer system or electronics device/product such as a personal computer, a network storage device, or any other suitable device and may vary in size, shape, performance, functionality, and price. These computer systems may include random access memory (RAM), one or more processing resources such as a central processing unit (CPU) or hardware or software control logic, ROM, and/or other types of nonvolatile memory, and the CPU and/or other electronic components may be adapted for passive cooling with a heat sink(s) of the present invention. Additional components of the system may include one or more disk drives, one or more network ports for communicating with external devices as well as various input and output (I/O) devices, such as a keyboard, a mouse, and a video display. The computer systems and/or servers may also include one or more buses operable to transmit communications between the various hardware components. Cooling for these computer or server components is provided with embodiments of fan modules taught herein with improved vibration isolation and/or enhanced installation and removal (e.g., with a reversible, counter-rotating design).

Figure 6:
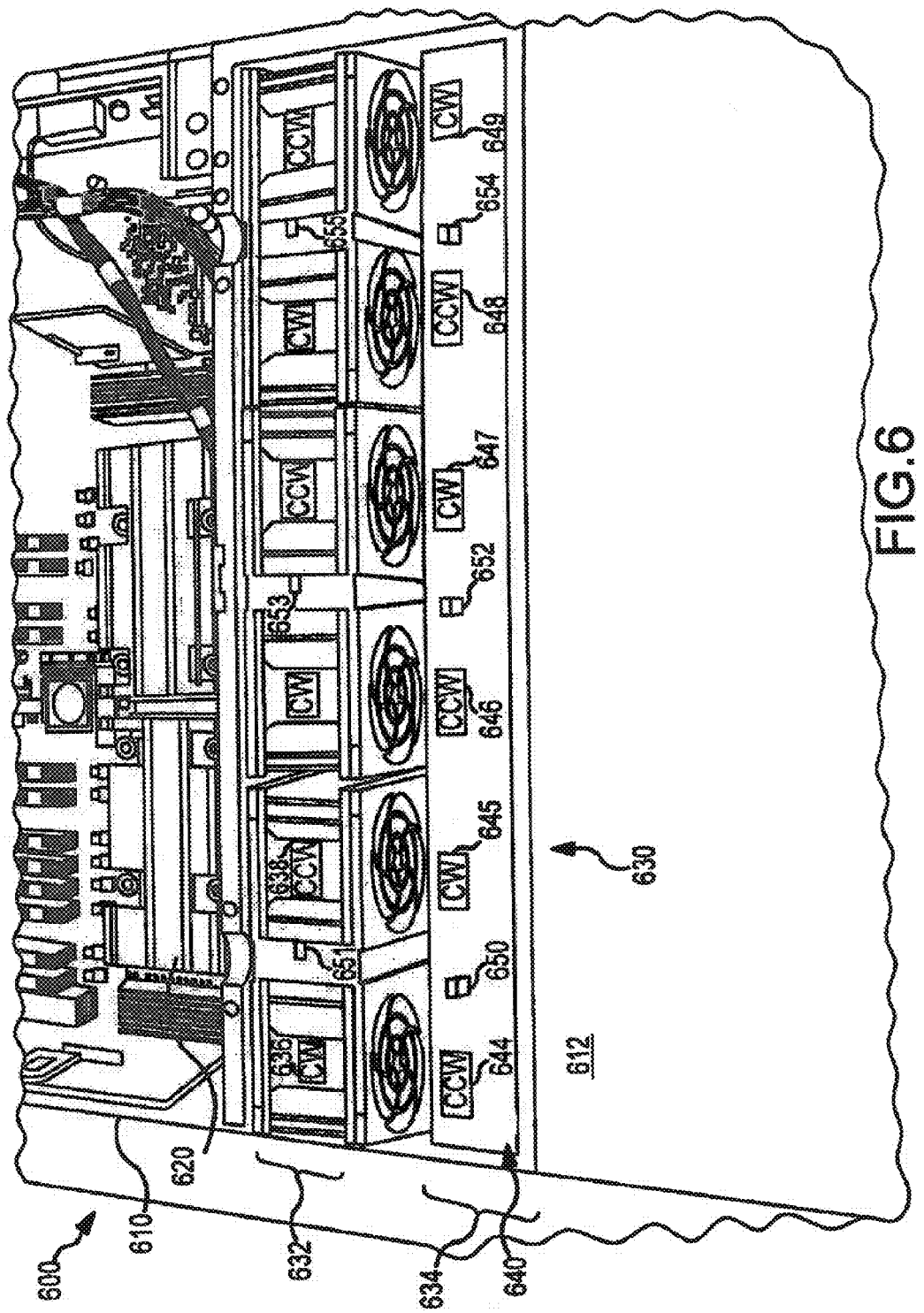
FIG. 6 is a top, perspective view of a computer chassis with a lid of the chassis or of the fan chamber removed showing a fan tray/deck or board adapted for receiving a row of fan modules configured in accordance with the present invention.

FIG. 6 illustrates a computer product such as a server 600 with a chassis or housing 610 in which a number of electronic components 620 have been positioned on a board (e.g., a PCBA or the like). A lid 612 is shown in an open position to expose the components 620 and to also show a cooling fan assembly 630 within a fan chamber of the housing 610 adjacent the components 620 (e.g., the fan assembly 630 provides cooling airflow for the components 620). The fan assembly 630 is arranged in a pair of rows or dual banks 632, 634, with this embodiment being designed to have 3 fan modules in each row or bank 632, 634 (e.g., 12 fans in the assembly 630). In FIG. 6, a fan tray or deck (or portion of a mounting board)

640 is shown that includes a set of mounting elements or male connectors 650, 652, 654 that extend upward (in this embodiment, but may also be female or other connectors) from the tray 650 within row 634. The combination of the positions or pattern of the connectors 650, 652, 654 and mating edge connector receptacles in the fan modules defines the arrangement of the fan modules in assembly 630 to provide counter-rotating pairs of fans. As shown, labels 644-649 indicate the direction of rotation of the fan to be mounted in each position in the tray 640. In row or bank 632, three fan modules in accordance with the invention are shown installed on the tray 640. As shown, the modules are mounted with their receptacles 651, 653, 655 offset from those 650, 652, 654 of row 634. Hence, as shown on the labels 636, 638, the fan modules in row 632 and in adjacent row 634 will be in opposite directions with each CW rotating fan paired (or aligned) with a CCW rotating fan in paired ones of the 6 modules.

Figure 7:
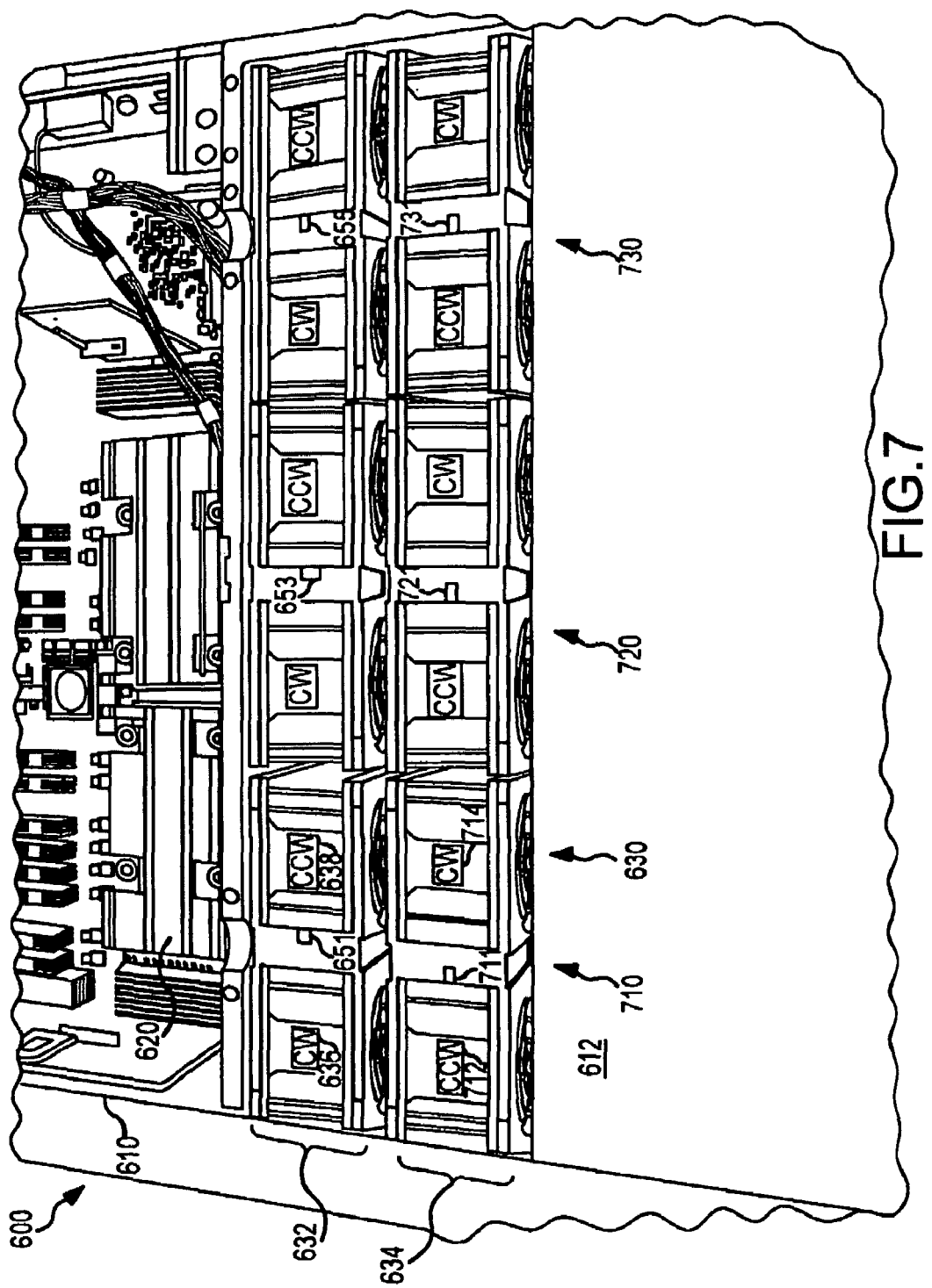
FIG. 7 is a view similar to that shown in FIG. 6 after installation of the row of fan modules to provide counter-rotating flow through each pair of fans in the adjacent rows.

FIG. 7 illustrates the computer product (e.g., server or the like) 600 with the cooling fan assembly 630 completed by insertion of modules in the row or bank 634. As shown, fan module 710 is inserted such that its connector receptacle 711 is offset from receptacle 651 (i.e., with an opposite receptacle receiving connector 650 to mount the module 710 on tray 640). In this arrangement, the fan module 710 is positioned (according to keyed pattern in tray 640) such that the fan label 712 indicates that left fan is a CCW fan and the fan label 714 indicates the right fan is a CW fan, while the fans in the paired module of row/bank 632 are counter rotating fans as indicated by labels 636,638 (e.g., are CW and CCW fans in this example). Likewise, fan modules 720 and 730 are inserted with their receptacles 721,731 offset from the corresponding receptacles 653,655 of paired modules from row/bank 632. In this manner, each pair of fans in rows/banks 632, 634 is a counter-rotating pair of fans and direct flow along a common (or near common) fan axis. The arrangement shows each module in a row being reversed from the neighboring module in the row (e.g., module 710 is reversed from module 720 in row 634) but this is not a requirement, and a number of patterns for the modules may be utilized as long as the modules are arranged such that the fan in the next row is counter-rotating.

Although not clearly shown in FIGS. 6 and 7, the airflow guides may be provided and would extend between the rows 632 and 634 for each fan pair, and, in some cases, from row 632 into the housing 610 where components 620 are located or from row 634 to the wall of housing to discharge the air (e.g., the airflow may be into the housing 610 or out of the housing 610 through the fan assembly 630 and the seals would be arranged to support such desired airflow). As shown in FIGS. 6 and 7, the fan modules 710, 720, 730 are provided with an identical or similar form factor as existing fan modules to allow them to readily be used in existing chassis 610. The board or tray 640 may be readily and simply modified to include the edge connectors 650, 652, 654 in a pattern to key or dictate where each fan module is positioned, and also to ensure that a paired module in an adjacent row is counter-rotating (e.g., does not have the same arrangement of the CW and CCW fans such as by having the receptacle in the connector body between the fan housings always proximal to the CCW fan or to the CW fan for example). The keying assures proper positioning in the assembly 630 (and in fan chamber) but labeling also may be used (with or without the keying arrangement (i.e., some embodiments may not including the special receptacles/connectors and may rely on labels alone) to verify the proper arrangement of the modules in the assembly 630.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A fan module for positioning in a fan tray of an electronic device, the fan tray having at least two rows for receiving sets of the fan modules, comprising:
a first fan supported within a first housing within the fan module; and
a second fan supported within a second housing, wherein the first and second housings are interconnected within the fan module and arranged in a side-by-side, spaced-apart arrangement, wherein the first fan has a clockwise-rotating blade and the second fan has a counterclockwise-rotating blade with the direction of blade rotation of the first fan and the second fan being determined from a same side of the fan module, and wherein airflow through the fan module is unidirectional;
wherein the fan tray comprises edge connectors arranged in a pattern defining a set of locations for the fan module to mount to the fan tray, whereby counter-rotating flow occurs between an adjacent pair of the fan modules positioned on the fan tray; and a connector assembly with a body positioned between the first and second housings to interconnect the housings, the body having connector receptacles for receiving one of the edge connectors positioned on opposite ends of the body and proximate to one of the clockwise-rotating and the counterclockwise-rotating fans.

2. The fan module of claim 1, wherein the first and second fans comprise axial fans with the blades rotating about first and second axes, the first and second axes being offset.

3. The fan module of claim 2, wherein the first and second axes are parallel.

4. The fan module of claim 2, wherein airflow through the first fan is in a first direction along the first axis and airflow through the second fan is in a second direction along the second axis generally matching the first direction, whereby the fan module has the unidirectional airflow.

5. The fan module of claim 1, wherein the body of the connector assembly includes a pair of edge connector receptacles each adapted for receiving one of the edge connectors and wherein the edge connector receptacles are positioned on opposites ends of the body and on one side of the body.

6. The fan module of claim 1, further comprising an airflow guide extending outward from an outlet of the first fan, the airflow guide comprising a sidewall defining an inner airflow chamber and a compressible sealing member distal to the first housing and extending about the airflow chamber.

7. A computer apparatus adapted for forced-air cooling, comprising:
a chassis including a mounting surface for receiving two parallel rows of cooling fans;
in a first of the rows, a first fan module with a first housing supporting a clockwise-rotating fan and a second housing supporting a counterclockwise-rotating fan with the direction of rotation of the fans being determined from a same side of the first fan module; and
in a second of the rows, a second fan module with a first housing supporting a counterclockwise-rotating fan and a second housing supporting a clockwise-rotating fan with the direction of rotation of the fans being determined from a same side of the second fan module, wherein the first and second fan modules are positioned with the two first housings adjacent to each other and the two second housings adjacent to each other;

wherein the first fan module and the second fan module are separately installable in receiving engagement with the mounting surface and the mounting surface comprises a plurality of edge connectors extending upward from the mounting surface and the first and second fan modules each comprise a connector body between the first and second housings with a pair of connector receptacles for receiving one of the edge connectors;

wherein the connector receptacles in the connector body are positioned on opposite ends of the connector body and proximate to one of the clockwise-rotating and the counterclockwise-rotating fans and wherein adjacent pairs of the edge connectors in the rows on the mounting surface are offset, whereby a counter-rotating pattern is defined for the cooling fans in the rows.

8. The computer apparatus of claim 7, wherein the clockwise-rotating fan in the first fan module rotates about a first axis and the counterclockwise-rotating fan in the second fan module rotates about a second axis, the first and second axes substantially coinciding.

9. The computer apparatus of claim 8, wherein the clockwise-rotating fan in the first fan module and the counterclockwise-rotating fan in the second fan module direct airflow in one direction.

10. The computer apparatus of claim 7, wherein the clockwise-rotating fan and the counterclockwise-rotating fan in the first fan module rotate about first and second axes, the first and second axes being offset and substantially parallel.

11. The computer apparatus of claim 7, further comprising airflow guides extending between adjacent the fans in the first and second modules, the airflow guides each comprising a foam sealing member forming a seal between the airflow guide and the second module proximate to an inlet to the fans in the second module.

12. A fan module for providing air cooling in a fan chamber of a computer chassis, comprising:
 a pair of fan support structures spaced apart and in a side-by-side arrangement;
 a clockwise-rotating, axial fan in a first of the fan support structures;
 a counterclockwise-rotating, axial fan in a second of the fan support structures, with the direction of rotation of the fans being determined from a same side of the fan module;
 a connector assembly with a body sandwiched between, and attached to, sidewalls of the fan support structures; and
 a pair of airflow guides affixed to sidewalls of the fan support structures adjacent outlets of the fans with a chamber directing outlet air from the fans, each of the airflow guides comprising a compressible seal member for mating with another of the fan modules,
 wherein the fan chamber comprises a mounting surface with edge connectors defining a pair of fan banks with adjacent pairs of the edge connectors being offset and wherein the body of the connector assembly comprises a pair of connector receptacles exposed on opposite ends of the body and adapted for receiving one of the edge connectors, the connector receptacles being offset from a center of the body on a like side of the body.

13. The fan module of claim 12, wherein blades of the clockwise-rotating fan and the counterclockwise-rotating fan rotate about a pair of parallel axes.

14. The fan module of claim 13, wherein the fans have matching airflow directions.

* * * * *

UNITED STATES PATENT AND TRADEMARK OFFICE
CERTIFICATE OF CORRECTION

PATENT NO. : 7,675,747 B1  Page 1 of 1
APPLICATION NO. : 12/331982
DATED : March 9, 2010
INVENTOR(S) : Ong et al.

It is certified that error appears in the above-identified patent and that said Letters Patent is hereby corrected as shown below:

Claim 5 Column 10, line 48, delete "opposites" and insert therefor --opposite--.

Signed and Sealed this

Twenty-seventh Day of April, 2010

David J. Kappos
*Director of the United States Patent and Trademark Office*